United States Patent
Choi et al.

(10) Patent No.: US 8,400,229 B2
(45) Date of Patent: Mar. 19, 2013

(54) VECTOR MODULATOR USING TIME DELAY AND PHASE SHIFTER

(75) Inventors: Heon soo Choi, Gwangmyeong (KR); Chang su Choi, Yongin (KR); Hyung jun Jeon, Hwaseong (KR); Yeong chan Kim, Seoul (KR); Jae hwan Im, Gwangmyeong (KR); Jin Kuk Hong, Hwaseong (KR)

(73) Assignee: LS Industrial Systems Co., Ltd., Anyang-Si, Gyeonggi-Do (KR)

( * ) Notice: Subject to any disclaimer, the term of this patent is extended or adjusted under 35 U.S.C. 154(b) by 130 days.

(21) Appl. No.: 13/042,376

(22) Filed: Mar. 7, 2011

(65) Prior Publication Data

US 2012/0229227 A1 Sep. 13, 2012

(51) Int. Cl.
*H03K 7/08* (2006.01)

(52) U.S. Cl. ........ 332/109; 332/103; 375/297; 375/298; 330/69

(58) Field of Classification Search .................. 332/103, 332/109; 375/298, 297; 330/69
See application file for complete search history.

(56) References Cited

U.S. PATENT DOCUMENTS

| 4,109,212 | A | 8/1978 | Donnell et al. |
| 5,019,793 | A | 5/1991 | McNab |
| 5,508,657 | A | 4/1996 | Behan |
| 5,768,699 | A | * | 6/1998 | Behan et al. .................. 455/296 |
| 2007/0152772 | A1 | 7/2007 | Runyon |

FOREIGN PATENT DOCUMENTS

| EP | 0364036 | 4/1990 |
| JP | 2001-326541 | 11/2001 |

* cited by examiner

*Primary Examiner* — Arnold Kinkead
(74) *Attorney, Agent, or Firm* — Lee, Hong, Degerman, Kang & Waimey

(57) ABSTRACT

An vector modulator using a time delay and a phase shifter is disclosed, the vector modulator including a time delay (110) varying a phase of an input signal by time-delaying the input signal; a first coupler (120) converting the signal outputted in changed phase through the time delay to an I channel signal and a Q channel signal each having a 90° phase difference and outputting the I/Q channel signals; a first phase shifter (130) varying the phase of the I channel signal outputted from the first coupler within a predetermined phase range and outputting the phase-variable I channel signal; a second phase shifter (140) varying the Q channel signal outputted from the first coupler within a predetermined phase range and outputting the phase-variable Q channel signal; and a second coupler (150) coupling phase-variable I/Q channel signals and outputting the coupled signals.

6 Claims, 3 Drawing Sheets

VECTOR MODULATOR USING TIME DELAY AND PHASE SHIFTER

BACKGROUND

The present disclosure relates to a vector modulator, and more particularly to a vector modulator configured to modulate magnitude and phase of an input signal by modulating a phase of I/Q channel signal, using time delay and phase shifter.

A vector modulator is a device employed by a calibrator and an amplifier for simultaneously controlling magnitude and phase of a signal. The vector modulator generally receives an input signal and outputs the signal by splitting it into In-phase (I) channel signal and quadrature (Q) channel signal having a particular phase. To this end, the input signal is converted into an I channel signal having a phase difference of 90° and a Q channel signal, where the I/Q signal is outputted in response to an outside control signal with each magnitude unchanged but with changed phase. The outputted signal is attenuated by an amplitude variable attenuator at a predetermined attenuation ratio and outputted with a vector sum thereof.

However, the prior art vector modulator makes four quadrant signals comprising a polar coordinate system, variably controls each amplitude of each quadrant signal using an amplitude variable attenuator, couples the same with the vector sum and output. Under the circumstances, the prior art vector modulator must be disadvantageously formed with an amplitude variable attenuator to complicate the circuit configuration.

Another disadvantage is that there is a cumbersomeness of converting each I/Q signal to amplitude control value in order to obtain an arbitrary phase angle for using the amplitude variable attenuator. Still another disadvantage is that there is a cumbersomeness of going through a complicated process for obtaining a phase angle outputted by a final vector sum.

SUMMARY

An object of the present disclosure is to solve at least one or more of the above problems and/or disadvantages in a whole or in part and to provide at least the advantages described hereinafter. In order to achieve at least the above objects, in whole or in part, and in accordance with the purposes of the invention, as embodied and broadly described, there is provided a vector modulator including a phase shifter configured to control magnitude and phase of an input signal using the phase shifter free from an amplitude variable attenuator.

Furthermore, there is provided a vector modulator including a phase shifter configured to accurately modulate an input signal free from complicated configuration over a prior art vector modulator.

In one general aspect of the present disclosure, there is provided a vector modulator using a time delay and a phase shifter, the modulator comprising: a time delay varying a phase of an input signal by time-delaying the input signal; a first coupler converting the signal outputted in changed phase through the time delay to an I channel signal and a Q channel signal each having a 90° phase difference and outputting the channel signals; a first phase shifter varying the phase of the I channel signal outputted from the first coupler within a predetermined phase range and outputting the phase-variable I channel signal; a second phase shifter varying the phase of the Q channel signal outputted from the first coupler within a predetermined phase range and outputting the phase-variable Q channel signal; and a second coupler coupling phase-variable I/Q channel signals respectively outputted from the first and second phase shifters and outputting the coupled signals.

Preferably, the time delay varies the phases while maintaining magnitude of the input signal.

Preferably, the time delay varies the phase of the input signal within the range of 0°~180° or 0°~360°.

Preferably, the first and second phase shifters vary respective phases of I/Q channel signals within the range of 0°~90°.

Preferably, the first and second phase shifters vary each phase of I/Q channel signals while maintaining respective magnitudes.

Preferably, the second coupler couples the respectively-outputted signals by vector sum.

Preferably, at least one of the first coupler and the second coupler includes a 90° hybrid coupler.

ADVANTAGEOUS EFFECTS

The vector modulator using a time delay and a phase shifter according to the present disclosure has an advantageous effect in that the vector modulator uses the time delay and the phase shifter free from an amplitude variable attenuator to simplify the system.

The vector modulator using a time delay and a phase shifter according to the present disclosure has another advantageous effect in that amplitude control is dispensed with to easily modulate signals.

Technical problems to be solved by the present disclosure are not restricted to the above-mentioned description, and any other technical problems not mentioned so far will be clearly appreciated from the following description by skilled in the art.

DETAILED DESCRIPTION

The following description is not intended to limit the invention to the form disclosed herein. Consequently, variations and modifications commensurate with the following teachings, and skill and knowledge of the relevant art are within the scope of the present invention. The embodiments described herein are further intended to explain modes known of practicing the invention and to enable others skilled in the art to utilize the invention in such, or other embodiments and with various modifications required by the particular application(s) or use(s) of the present invention.

Figure 1:
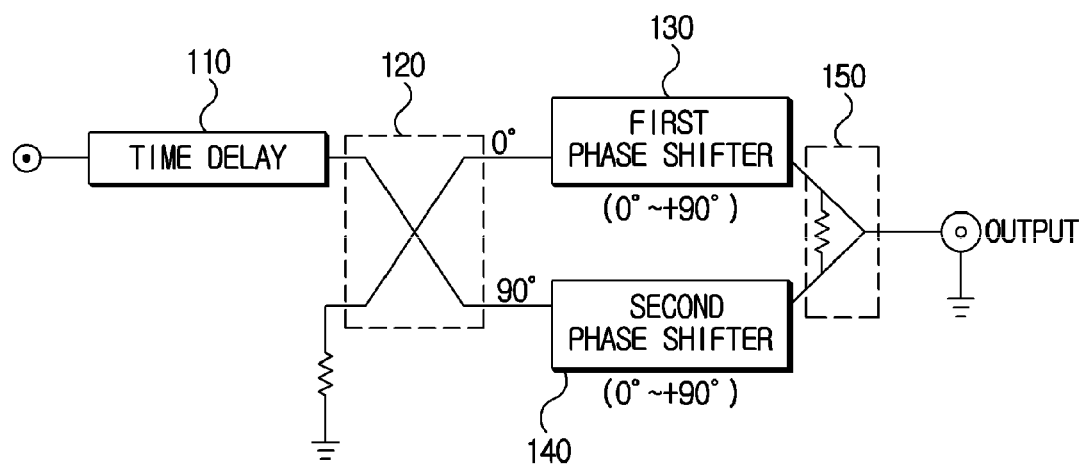
FIG. 1 is a schematic diagram illustrating a vector modulator including a time delay and a phase shifter according to an exemplary embodiment of the present disclosure.
Figure 2:
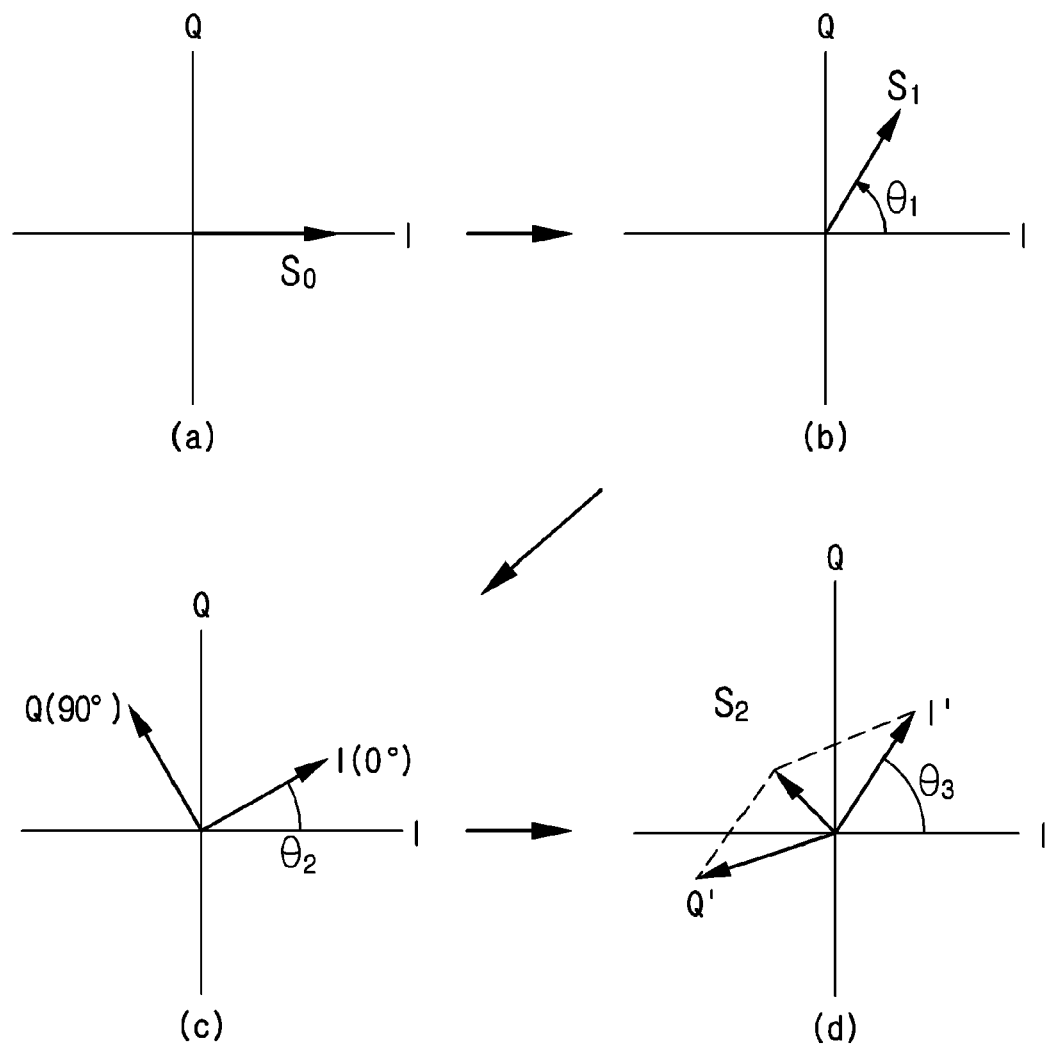
FIG. 2 is an example of a vector diagram illustrating an operation of a vector modulator according to an exemplary embodiment of the present disclosure.
Figure 3:
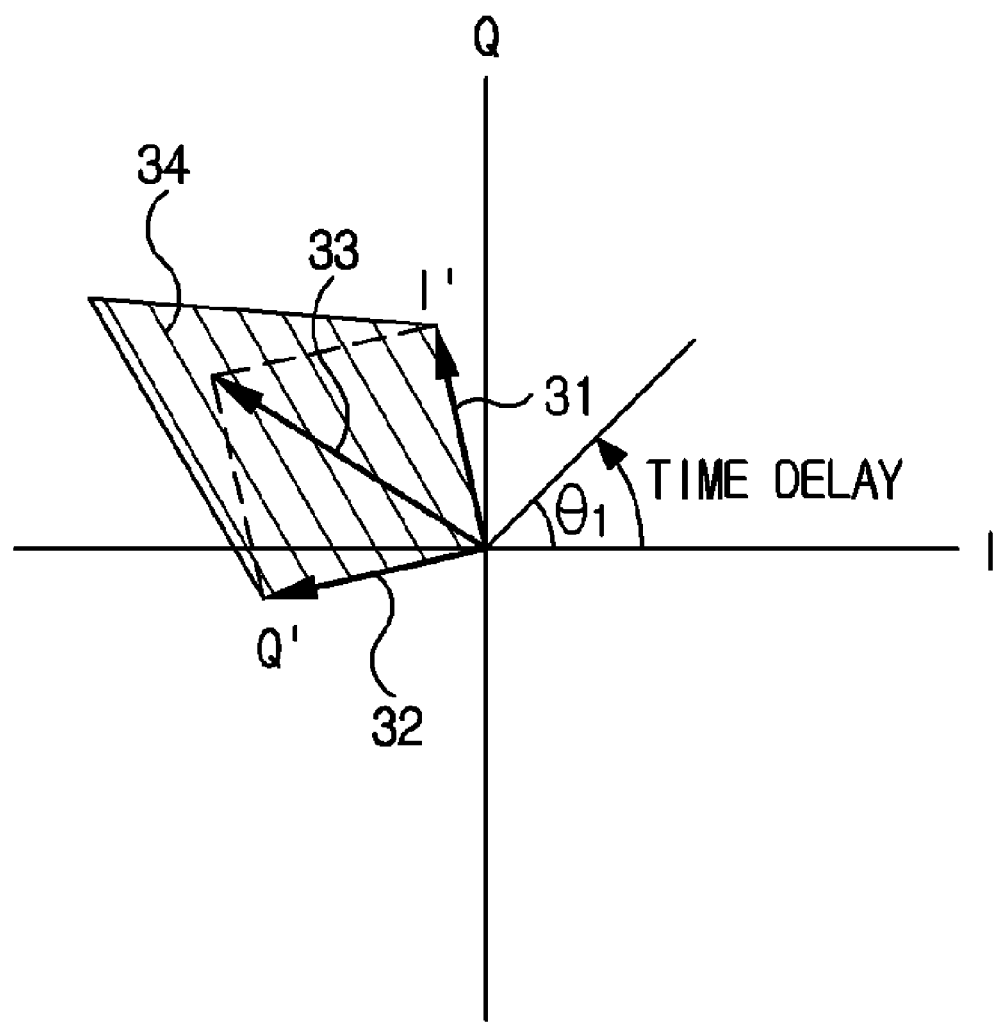
FIG. 3 is an example of a vector diagram illustrating a phase variable region of an output signal in a vector modulator according to an exemplary embodiment of the present disclosure.

The disclosed embodiments and advantages thereof are best understood by referring to FIGS. 1-3 of the drawings, like numerals being used for like and corresponding parts of the various drawings. Other features and advantages of the disclosed embodiments will be or will become apparent to one of ordinary skill in the art upon examination of the following figures and detailed description. It is intended that all such additional features and advantages be included within the scope of the disclosed embodiments, and protected by the accompanying drawings. Further, the illustrated figures are only exemplary and not intended to assert or imply any limitation with regard to the environment, architecture, or process in which different embodiments may be implemented. Accordingly, the described aspect is intended to embrace all such alterations, modifications, and variations that fall within the scope and novel idea of the present invention.

It will be understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. That is, the terms "including", "includes", "having", "has", "with", or variants thereof are used in the detailed description and/or the claims to denote non-exhaustive inclusion in a manner similar to the term "comprising".

Furthermore, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated. That is, in the drawings, the size and relative sizes of layers, regions and/or other elements may be exaggerated or reduced for clarity. Like numbers refer to like elements throughout and explanations that duplicate one another will be omitted.

Now, the present invention will be described in detail with reference to the accompanying drawings.

FIG. 1 is a schematic diagram illustrating a vector modulator including a time delay and a phase shifter according to an exemplary embodiment of the present disclosure.

Referring to FIG. 1, a vector modulator including a time delay and a phase shifter according to an exemplary embodiment of the present disclosure includes a time delay (110), a first coupler (120), a first phase shifter (130), a second phase shifter (140) and a second coupler (150).

The time delay (110) functions to vary a phase of an input signal to a predetermined phase variable scope. The time delay (110) may operate as a phase delay, for example, and vary only the phase without changing the magnitude of the input signal. For example, in a case the vector modulator according to the present disclosure is applied to a transmission leakage signal removal device, the time delay (110) delays the time of the input signal to have a phase opposite to that of the transmission leakage signal removal device, whereby the phase thereof is adjusted. At this time, the phase variation resultant from time delay by the time delay (110) can be varied within a phase range of 0°~360°.

However, the variation in the present exemplary embodiment of the present disclosure is preferably within 0°~180°. The reason is that the phase variable range of 0°~180° can be enough to synthesize signals of four quadrants. In case of phase variable range of 0°~360°, there is an advantage of increasing a maximum magnitude range of synthesized vector when compared with the application of the phase variable range of 0°~180°.

The first coupler (120) converts the phase-variable signal by the time delay (110) to I channel signal and Q channel signal each having a phase difference of 90° and outputs the converted signals. The first coupler (120) according to the exemplary embodiment of the present invention may be preferably implemented by a 90° hybrid coupler. At this time, the first coupler (120) maintains magnitude of the input signal but converts to I channel signal and Q channel signal and outputs the signals.

The first and second phase shifters (130, 140) respectively vary the I channel signal and Q channel signal among the output signals of the first coupler (120) to within a predetermined phase range. In the present exemplary embodiment, the first and second phase shifters (130, 140) respectively vary each phase of the I/Q channel signals to within the phase variable range of 0° 90°. At this time, each magnitude of relevant channel signals is not changed or not varied.

The second coupler (150) couples the I channel signal outputted by being varied in phase by the first phase shifter (130) and the Q channel signal outputted by being varies in phase by the second phase shifter (140), and outputs the signals. At this time, the coupling of these channel signals is implemented by vector sum. Thus, the output signals coupled are varied in magnitude and phase when compared with the initial input signal inputted to the time delay (110).

As noted above, in the present disclosure, the phase of an input signal is varied to a predetermined phase range, converted to I/Q channel signals each having a 90° phase difference and outputted, and the converted phases of I/Q channel signals are respectively varied to predetermined phase ranges and re-coupled, whereby the coupled signals are modulated in magnitudes and phases compared with the initially inputted signal, and outputted.

As apparent from the foregoing, a further simplified vector modulator can be implemented by modulating magnitudes and phases of input signals to generate new output signals, using a time delay varying phases by delaying times of the input signals, and two phase shifters respectively varying the phases of I/Q channel signals.

FIG. 2 is an example of a vector diagram illustrating an operation of a vector modulator according to an exemplary embodiment of the present disclosure.

Referring to FIG. 2(a), in a case an input signal (S0) having an arbitrary magnitude and phase is inputted to the time delay (110), the input signal is converted to a signal (S1) varied in phase as much as θ1 but with the same magnitude through time delay by the input signal (S0) and outputted as shown in FIG. 2(b). At this time, the time delay (110) delays the phase to cater to the purpose of the vector modulator.

For example, as noted above, in order to use the input signal for removal of leakage signal, the input signal is time-delayed to have a phase opposite to that of the leakage signal, such that the phase can be an opposed (anti) phase of the leakage signal.

FIG. 2 (b) illustrates an example where, assuming that the leakage signal is positioned at a third quadrant, the phase-variable output signal (S1) is made to be positioned in a first quadrant to have a phase opposite to that of the leakage signal.

As noted above, the phase-variable output signal (S1) is converted to an I channel signal (I) and a Q channel signal (Q), each having a 90° phase difference and outputted, as illustrated in FIG. 2 (c).

Successively, as illustrated in FIG. 2 (d), the first phase shifter (130) varies the phase of the I channel signal (I) to a predetermined phase (I'), and the second phase shifter (140) varies the phase of the Q channel signal (Q) to a predetermined phase (Q'), where the phase-variable I/Q channel signals (I', Q') are coupled by the second coupler (150) in a vector sum, and outputted as a magnitude/phase-modulated output signal (S2). The input signal (S0) is outputted as a new output signal (S2) that is modulated in magnitude and phase through the above-mentioned processes.

FIG. 3 is an example of a vector diagram illustrating a phase variable region of an output signal in a vector modulator according to an exemplary embodiment of the present disclosure.

Referring to FIG. 3, the time delay (110) of a vector modulator according to the present disclosure delays an input signal as much as a predetermined time to vary a phase as much as θ1. The first and second phase shifters (130, 140) maintain the magnitude of I/Q channel signals each having a 90° phase difference, and vary the phases within the phase range of 0°~90°.

At this time, as noted above, the phase-variable I channel signal (31) and Q channel signal (32) are varied in phases thereof by the first and second phase shifters (130, 140) within the phase range of 0°~90°, whereby magnitudes of coupled signals can be adjusted.

In a case I channel signal (31) and Q channel signal (32) are equally controlled, magnitudes of the signals can be controlled without any change in phase axis. The control of each of I/Q channel signals can vary the phase within a restricted range.

As noted above, as the time delay (110) initially varies the phase, and the first and second phase shifters (130, 140) secondarily vary the magnitudes, an output signal that is finally synthesized and outputted has an adjusted shape in phase and magnitude compared with those of the input signal.

As noted from FIG. 3, the present disclosure can use the time delay and phase shifters to vary phases relative to a part region of polar coordinate which is an I/Q vector diagram.

Furthermore, variation of phases of I/Q channel signals by the phase shifters can vary magnitudes of synthesized vectors of I/Q channel signals, which means that the magnitude and phase of an output signal can be modulated in comparison to an input signal.

As a result, signals can be modulated using only time delay and phase shifters to simplify configuration and circuit of vector modulator without a plurality of amplitude variable attenuator as in the prior art vector modulator.

The I/Q vector modulator is widely used in various fields such as measuring instruments, radio transceivers and amplifiers. The vector modulator outputs an input signal as I/Q signals, controls only the phases while keeping magnitudes of I/Q signals as they are, and controls the magnitude and phase of the input signal. Recently, as high performance, simplification and cost reduction of these electronic products come into focus, modules and parts used for these electronic products receive a high interest.

In view of this aspect, the vector modulator using time delay and phase shifters according to the present disclosure possesses an advantage in that configuration can be simplified to reduce manufacturing cost, because the prior art amplitude variable attenuator is dispensed with, and time delay and phase shifters are instead employed to construct an I/Q vector modulator. Therefore, it should be apparent that the vector modulator using time delay and phase shifters according to the present disclosure may be usefully applied to various industrial fields using I/Q vector modulator.

Although embodiments have been described with reference to a number of illustrative embodiments thereof, it should be understood that numerous other modifications and embodiments can be devised by those skilled in the art that will fall within the spirit and scope of the principles of this invention. More particularly, various variations and modifications are possible in the component parts and/or arrangements of the subject combination arrangement within the scope of the disclosure, the drawing and the appended claims. In addition to variations and modifications in the component parts and/or arrangements, alternative uses will also be apparent to those skilled in the art.

What is claimed is:

1. A vector modulator configured for generating a cancellation signal for a transmission leakage signal in a radio transceiver system, the vector modulator comprising:
   a time delay configured for varying a phase of an input signal by time-delaying the input signal;
   a first coupler configured for:
      converting the phase-varied input signal into an I-channel signal and a Q-channel signal, the I- and Q-channel signals each having a 90° phase difference relative to the input signal, and
      outputting the I-channel signal and the Q-channel signal;
   a first phase shifter configured for:
      varying a phase of the output I-channel signal within a first predetermined phase range, and
      outputting the phase-varied I-channel signal;
   a second phase shifter configured for:
      varying a phase of the output Q-channel signal within a second predetermined phase range, and
      outputting the phase-varied Q-channel signal; and
   a second coupler configured for:
      coupling the output phase-varied I-channel signal and Q-channel signal via vector summation, and
      outputting the coupled I-channel signal and Q-channel signal.

2. The vector modulator of claim 1, wherein the time delay is further configured for maintaining a magnitude of the input signal while varying the phase of the input signal.

3. The vector modulator of claim 2, wherein the input signal is phase-varied within a range of 0°~360°.

4. The vector modulator of claim 1, wherein:
   the first predetermined phase range is within a range of 0°~90°; and
   the second predetermined phase range is within the range of 0°~90°.

5. The vector modulator of claim 4, wherein:
   the first phase shifter is further configured for maintaining a magnitude of the output I-channel signal while varying the phase of the output I-channel signal; and
   the second phase shifter is further configured for maintaining a magnitude of the output Q-channel signal while varying the phase of the output Q-channel signal.

6. The vector modulator of claim 1, wherein at least the first coupler or the second coupler comprises a 90° hybrid coupler.

* * * * *